United States Patent [19]

Yoo

[11] 3,848,075

[45] Nov. 12, 1974

[54] METHOD FOR SPLICING COMPOUND SUPERCONDUCTORS

[75] Inventor: Jack A. Yoo, Sunnyvale, Calif.

[73] Assignee: Varian Associates, Palo Alto, Calif.

[22] Filed: Dec. 27, 1971

[21] Appl. No.: 212,467

[52] U.S. Cl. ................ 174/94, 174/DIG. 6, 29/628, 29/599

[51] Int. Cl. ........................................... H02g 15/08

[58] Field of Search .......... 174/94, DIG. 6; 29/599, 29/628, 630 F

[56] References Cited

UNITED STATES PATENTS

| | | | |
|---|---|---|---|
| 3,449,092 | 6/1969 | Hammond | 29/599 X |
| 3,465,430 | 9/1969 | Barber et al. | 29/599 |
| 3,523,361 | 8/1970 | Kinter et al. | 174/94 R X |

*Primary Examiner*—Bernard A. Gilheany
*Assistant Examiner*—D. A. Tone
*Attorney, Agent, or Firm*—Stanley Z. Cole; Gerald M. Fisher

[57] ABSTRACT

High field compound superconductive members, such as $Nb_3Sn$, $V_3Ga$ and $V_3Si$, are spliced by assembling a layer of particulate material containing the constituent elements of a high field compound superconductor between the exposed surfaces of the two members to be spliced. The assembly is heated to reaction temperature in the presence of an inert atmosphere having a trace of carbon vapor to react the constituent particulate matter to form a high field compound superconductive splice between the members being spliced. The carbon vapor can be introduced into the splice by coating or saturating the assembly with a liquid material containing carbon, such as xylene or carbon tetrachloride. As an alternative, an organic liquid material or gaseous material may be introduced into the hot zone of the reaction furnace, as by bubbling the inert gaseous atmosphere of the furnace through an organic liquid or by introducing an organic gas into the inert atmosphere of the furnace.

11 Claims, 5 Drawing Figures

METHOD FOR SPLICING COMPOUND SUPERCONDUCTORS

DESCRIPTION OF THE PRIOR ART

Heretofore, high field compound superconductors have been spliced by assembling a layer of particulate material containing the constituent elements of a high field compound superconductor between the exposed surfaces of the two superconductors to be spliced and then heating the assembly to react the constituent elements of the compound superconductor to form a high field compound superconductor splice between the members. Such a method for forming a splice is disclosed and claimed in U.S. Pat. No. 3,523,361 issued Aug. 11, 1970, and assigned to the same assignee as the present invention.

One of the problems encountered in production of superconductive splices employing the aforecited prior art method was that the reliability of the splice was poor, particularly at high field use, i.e., magnetic field intensities greater than 5 kilogauss. Considerable flux jumping was encountered in the splice and the splice would go normal, i.e., quench the superconductive mode of conduction of the solenoid or coil of which the splice was a part.

SUMMARY OF THE PRESENT INVENTION

The principal object of the present invention is the provision of an improved method for splicing compound superconductors and superconductive splices formed thereby.

In one feature of the present invention, an organic vapor is introduced into the particulate constituent elements of a high field compound superconductive splice during the high temperature reaction of the constituent elements, whereby the reliability of the splice is greatly increased especially in high field use.

In another feature of the present invention, carbon vapor is introduced into the constituent elements of the splice, which elements are to be reacted at high temperature to form the high field compound superconductive splice by coating or saturating the assembled splice, prior to reaction, with a liquid carbon bearing material.

In another feature of the present invention, the carbon vapor is introduced into the constituent elements of the splice by introducing a trace amount of organic carbon bearing gas into the inert gaseous atmosphere of the sintering furnace which is used to react the constituents of the splice.

In another feature of the present invention, a carbon bearing organic vapor is introduced into the inert atmosphere of the sintering furnace, for sintering constituent elements of a compound superconductive splice, by bubbling the inert atmosphere of the furnace through a liquid carbon bearing organic material.

Other features and advantages of the present invention will become apparent upon a perusal of the following specification taken in connection with the accompanying drawings wherein:

DESCRIPTION OF THE PREFERRED EMBODIMENTS

Figure 1:
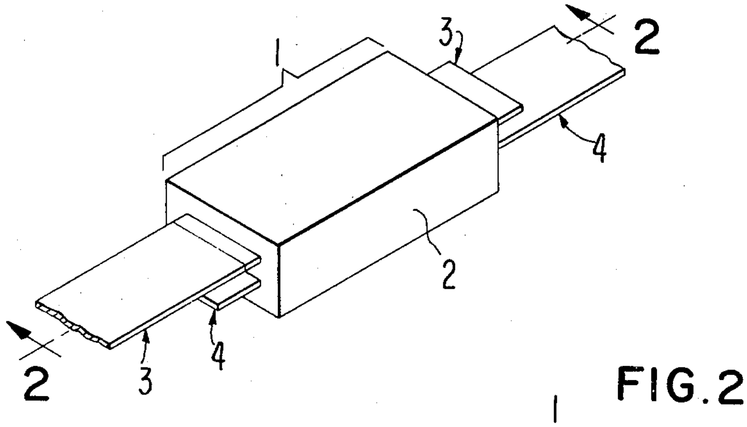
FIG. 1 is a perspective view of a high field superconductive splice incorporating features of the present invention.

Referring now to FIG. 1, there is shown the high field superconductive splice 1 for splicing together two high-field compound superconductors. The splice 1 includes a block-like body structure 2 of particulate material forming a high-field compound superconductive member fused together and fused to a first and second high field compound superconductive wire member portions 3 and 4 which are embedded in the block body 2. The high field compound superconductive block body 2 provides a high field superconductive bridge between the two compound superconductive wire members portions 3 and 4.

As used herein, the term "high field" is defined to mean a superconductive material having a critical magnetic field intensity greater than 20 kilogauss at 4.2° K. As used herein, "compound superconductor" is defined to mean a superconductive material which is essentially a compound as contrasted with an alloy. Examples of compound superconductors include $Nb_3Sn$, $V_3Ga$, and $V_3Si$, in contrast to alloy-type superconductors would include Nb-Zr and Mo-Re.

Figure 3:
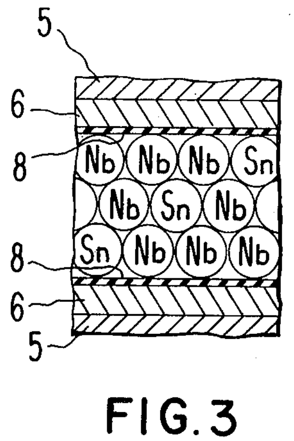
FIG. 3 is an enlarged detail view of a portion of the structure of FIG. 2 delineated by line 3—3.
Figure 2:
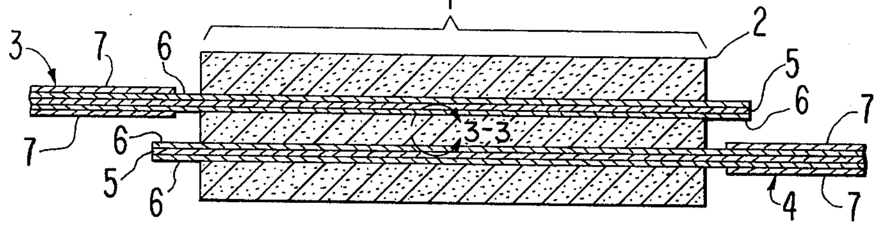
FIG. 2 is an enlarged sectional view of the structure of FIG. 1 taken along line 2—2 in the direction of the arrows.
Figures 4, 5:
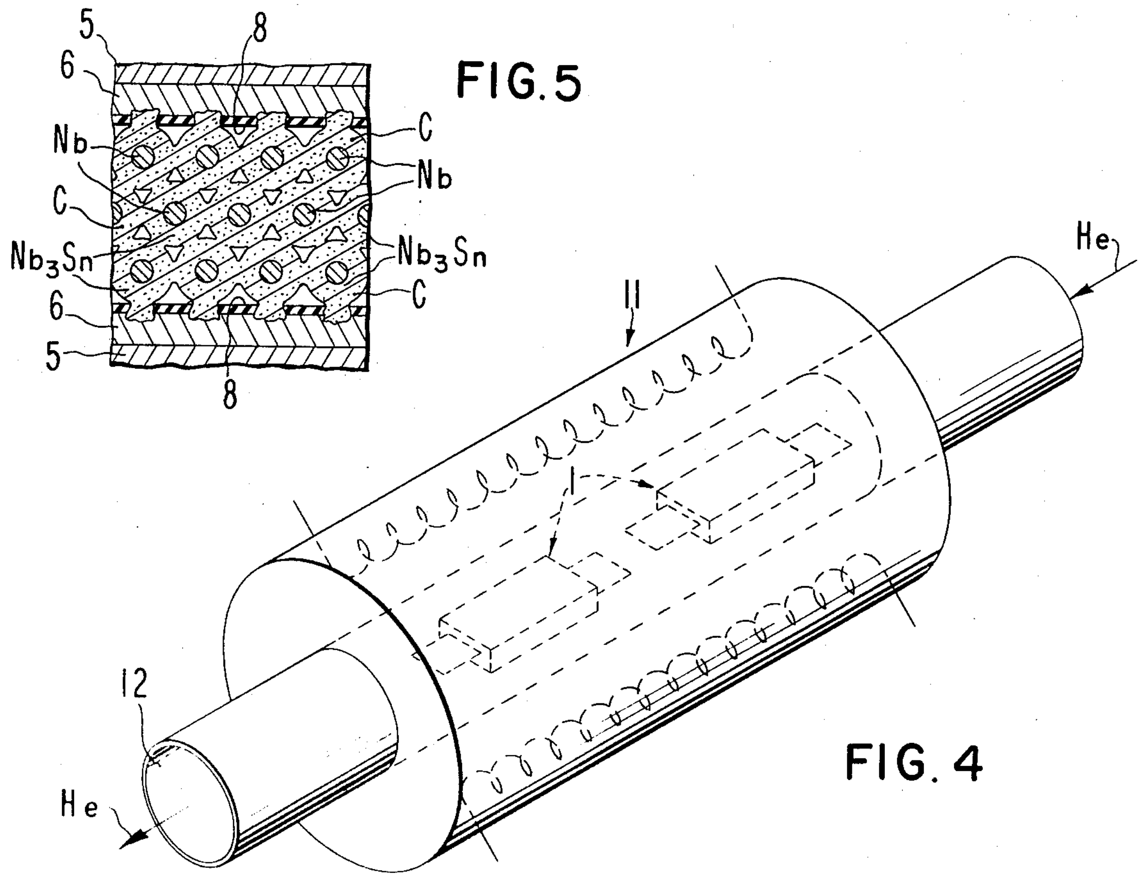
FIG. 4 is a schematic perspective view of a sintering furnace for reacting the constituents of the splice at high temperature.
FIG. 5 is a view similar to that of FIG. 3 depicting the powder composition after a high temperature reaction.

Referring now to FIGS. 2, 3 and 4, the superconductive splice of the present invention will be described in greater detail along with the method for making same. The two superconductive member portions 3 and 4, to be spliced, may take any one of a number of different forms and geometries. For example, such members may comprise the ends of two wires of circular cross section or, as in the case depicted, may comprise the ends of ribbon-shaped superconductive members. Such ribbon-shaped conductors are especially suitable for winding extremely high field superconductive solenoids. For the particular case illustrated in the figures, the ribbon superconductor comprises a ribbon substrate member 5, as of a nickel-molybdenum alloy material, having a melting point of 1,320° C. and commercially available from Haynes Stellite Company of Kokomo, Indiana, as Hastelloy Alloy B. In one Example, the substrate ribbon 5 has a thickness of 0.002 inch and a width of 0.090 inch.

A thin layer of high field superconductive material 6 is formed on the substrate ribbon 5. The high field superconductive layer material may comprise any one of a number of materials, such as $Nb_3Sn$, deposited to a thickness as of 0.0003 inch on the substrate ribbon 5. A coating 7 of a nonsuperconductive metal such as silver or copper forms a conductive jacket over the superconductive layer 6. The conductive jacket 7 preferably has good thermal and electrical conductivities and, in the case of silver, is deposited to a thickness of 0.0005 inch over the superconductive layer 6.

In the region of the splice 1, the conductive jacket 7 is stripped from the ends of the superconductive member portions 3 and 4 to be spliced together, thereby exposing the superconductive layer 6 such that, in the region of the bond, an intimate electrical contact may be made to the superconductive layer 6. In making the splice 1, the exposed ends of the superconductive member 3 and 4 are overlapped 0.75 of an inch and spaced apart approximately 0.015 of an inch in the cavity of a die which is filled with powder material containing the constituent elements of a high field compound superconductor.

For example, in the case of splicing $Nb_3Sn$ superconductive layers 6, the die is filled with Nb and Sn powders intimately mixed together and preferably having particle sizes less than the hole size of a 325 mesh screen. The powder mixture, in the case of niobium and tin powders, contains between 4 percent and 16 percent by weight tin and preferably 8 percent tin by weight with the remainder being niobium.

After embedding the superconductive member portions 3 and 4 in the powders, the powders are compacted into intimate contact with each other and with the superconductive layers 6 by subjecting the die containing the powders and the superconductive members 3 and 4 to compression in a hydraulic press. The powders are preferably compacted with a pressure falling within the range of 5,000 to 20,000 psi. Upon compacting, the particles of the powders are mechanically locked together to form a body 2 of particulated material which has sufficient mechanical strength to be removed from the die and handled while retaining its pressed shape. In this form, the splice body 2 can stand a limited amount of handling as required to transport the splice 1 to a furnace.

In the compacted state and before further treatment, a region of the splice between the two superconductive wire member portions 3 and 4 has a configuration as schematically depicted in greater detail in FIG. 3. More specifically, the mixture of niobium and tin powders are in intimate contact with a thin oxide layer 8 on the outside surface of the exposed ends of the $Nb_3Sn$ superconductive layer 6. This oxide layer 8 forms immediately upon exposure of the superconductive layer 6 to the earth's atmosphere since the $Nb_3Sn$ material is highly reactive with oxygen and water in the atmosphere, as are the other types of compound superconductors. It appears that this oxide layer 8, in the past has prevented the formation of a reliable superconductive splice since the oxide layer is insulative and would prevent the formation of a superconductive bridge between the two superconductive layers 6.

Next, the splice 1 is coated with a liquid organic material such as xylene or carbon tetrachloride. An especially convenient way to coat and to saturate the splice 1 is merely to immerse the splice 1 in a beaker of the organic liquid. However, the splice may be coated in any one of a number of different ways, such as by painting, spraying, coating or the like.

Referring now to FIG. 4, the splice 1 is next inserted into a furnace 11 which contains a centrally disposed axially directed quartz tube 12 around which a thermally insulative cylindrical chamber is formed having therein a plurality of electrical heating elements for heating the quartz tube and the contents thereof to a desired operating temperature as of 900° to 1,000° C. An inert gaseous atmosphere, as of helium, is caused to flow slowly through the tube 12 for immersing the splice in an inert atmosphere and for carrying off undesired reaction products. In the furnace 11 the splices 1 are reacted at high temperature to form a superconductive bridge between the superconductive layers 6.

More specifically, in the case of niobium and tin powders, the splice is heated to a temperature above 930° C and preferably within the range of 950° to 960° C for approximately three minutes to form a $Nb_3Sn$ high field superconductive material bridging the gap between the two superconductive layers 6.

It is believed that the tin, which has a relatively low melting point, reacts with the oxide layers 8 to break through the insulative layer 8 and that the Sn diffuses into the niobium particles and reacts to form $Nb_3Sn$ compound on the outside of all the intimately contacting niobium particles to form an intimate $Nb_3Sn$ contact at the interface with the superconductive layers 6. The result is the formation of a high field $Nb_3Sn$ compound superconductive bridging structure between superconductive layers 6. The bridging structure retains its particulated form as depicted in FIG. 5.

In the presence of the high temperature inert helium gas atmosphere the organic liquid coating that was placed on the splice 1 is vaporized and decomposed to produce trace quantities of atomic carbon and hydrogen in the case of a hydrocarbon coating or carbon and chlorine in the case of a carbon tetrachloride coating. The effect of the carbon is not understood but it is believed that the carbon diffuses into and throughout the reacting constituent elements of the superconductive bridge to form impurity sites therein. It is believed that the impurity sites serve as pinning sites for the magnetic flux produced when the current is flowing through the splice in a superconductive mode, thereby preventing premature flux jumps and thus quenching of the superconductive mode.

The carbon impurities are schematically depicted in FIG. 5 as the small block dots therein. While it is believed that the carbon impurity serves to provide flux pinning sites in the resultant superconductive splice, it is possible, in the case of a hydrocarbon vapor, that the hydrogen assists in reducing the oxide layers on the particles of the bridge and on the superconductive layers 6. Thus a trace amount of atomic carbon within the superconductive bridge, greatly improves the reliability of the resultant superconductive splice.

Although induction of the organic (carbon) impurity has thusfar been achieved in the description by coating and saturating the splice 1 with liquid organic material, as an alternative, organic vapor may be incorporated into the splice by inducting same into the reaction zone of the furnace. This is readily accomplished by introducing a small amount of organic vapor or organic liquid into the helium or inert gaseous atmosphere of the furnace, as by bubbling the helium gas through the organic liquid or by introducing an organic gas, such as methane, into the helium gas stream. Only trace amounts of such organic vapors need be introduced into the inert atmosphere of the furnace. The flow rate of inert gas is preferably kept to a low rate such that the organic vapor is not swept out of the furnace without permeating the region of the splice during the reaction.

The high field compound superconductive splice between the two superconductive layers 6 may be formed of other high field compound superconductors, such as $V_3Ga$ or $V_3Si$, formed in a similar manner, as above described, between the two superconductive members 3 and 4 to be joined. More specifically, powders containing the constituent elements of a high field compound superconductor are compacted in the space between the two superconductive members 3 and 4 to be joined. The compacted powders are reacted at high temperature in an inert atmosphere with a trace amount of organic vapor to form the superconductive material in place between the two member portions 3 and 4 to be joined.

Since many changes could be made in the above construction and many apparently widely different embodiments of this invention could be made without departing from the scope thereof, it is entended that all matter contained in the above description or shown in the accompanying drawings shall be interpreted as illustrative and not in a limiting sense.

What is claimed is:

1. In a method for splicing high field compound superconductors the steps of, exposing surface portions of said superconductors to be spliced, assembling a layer of particulate material containing the constituent elements of a high field compound superconductor between said exposed surface portions to be spliced, and heating the assembly in the presence of an organic vapor to react the constituent elements of the compound superconductor to form a high field compound superconductive bridge between the member portions being spliced.

2. The method of claim 1 wherein the organic vapor includes the element carbon.

3. The method of claim 1 wherein the assembly is heated in an inert gaseous atmosphere in the presence of a trace amount of organic vapor.

4. The method of claim 3 wherein the organic vapor is a vapor of the group consisting of xyline, and carbon tetrachloride.

5. The method of claim 1 wherein the step of assembling a layer of particulate material containing the constituent elements of a high field compound superconductor includes the step of, compacting the layer of particulate material together into intimate contact with the two member portions to be spliced with a compacting pressure within the range of 5,000 to 20,000 psi.

6. The method of claim 1 wherein the high field compound superconductive material to be spliced is $Nb_3Sn$ and the particulate material which is to be heated comprises particles of Nb and Sn.

7. The method of claim 6 wherein the Nb and Sn particles are heated to a temperature between 900° and 1,000° C.

8. The method of claim 1 wherein the assembly is heated in the presence of an inert gaseous atmosphere having a trace amount of the carbon vapor therein, and including the step of introducing the trace amount of carbon vapor into the inert gaseous atmosphere by bubbling the gaseous atmosphere through an organic liquid.

9. The method of claim 1 wherein the step of heating the assembly in the presence of an organic vapor includes heating the assembly in the presence of an inert gaseous atmosphere containing a trace amount of carbon vapor, and wherein the carbon vapor is introduced into the inert gaseous atmosphere by flowing a trace amount of organic vapor into the inert gaseous atmosphere.

10. A superconducting splice comprising, a plurality of high field compound superconductors, means forming a high field compound superconductive bridge connected between said plurality of high field compound superconductors being spliced, and said high field compound superconductive bridging means containing a trace amount of atomized organic material, whereby the reliability of the splice is significantly improved.

11. The apparatus of claim 9 wherein the trace amount of organic material is atomized carbon.

* * * * *